(12) United States Patent
Yu et al.

(10) Patent No.: US 9,330,731 B2
(45) Date of Patent: May 3, 2016

(54) CIRCUITS IN STRAP CELL REGIONS

(71) Applicant: TAIWAN SEMICONDUCTOR MANUFACTURING COMPANY LTD., Hsinchu (TW)

(72) Inventors: Hua-Hsin Yu, Hsinchu (TW); Hsiu Fen Peng, Hsinchu County (TW); Hau-Tai Shieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 105 days.

(21) Appl. No.: 14/182,007

(22) Filed: Feb. 17, 2014

(65) Prior Publication Data

US 2015/0235675 A1    Aug. 20, 2015

(51) Int. Cl.
*G11C 14/00* (2006.01)
*G11C 5/06* (2006.01)
*G11C 5/02* (2006.01)

(52) U.S. Cl.
CPC ... *G11C 5/06* (2013.01); *G11C 5/02* (2013.01)

(58) Field of Classification Search
CPC ....................................................... G11C 14/00
USPC ............................................................. 365/51
See application file for complete search history.

(56) References Cited

U.S. PATENT DOCUMENTS

| | | | | |
|---|---|---|---|---|
| 6,064,612 | A * | 5/2000 | Agata | 365/207 |
| 2002/0110015 | A1 * | 8/2002 | Keeth | 365/51 |
| 2003/0156457 | A1 * | 8/2003 | Ooishi | 365/185.21 |
| 2005/0068841 | A1 * | 3/2005 | Sommer et al. | 365/232 |

* cited by examiner

*Primary Examiner* — Min Huang
(74) *Attorney, Agent, or Firm* — Chun-Ming Shih

(57) ABSTRACT

A circuit comprises a first transistor and a second transistor in a strap cell region between a first memory array and a second memory array of a memory device. The first transistor includes a first node connected to a first data line, and a second node connected to a second data line. The first node and the second node of the first transistor are complementary to each other in voltage level. Further, the second transistor includes a first node connected to the second data line, and a second node connected to the first data line. The first node and the second node of the second transistor are complementary to each other in voltage level.

18 Claims, 7 Drawing Sheets

CIRCUITS IN STRAP CELL REGIONS

BACKGROUND

In semiconductor memory devices, memory arrays are separated from each other by straps. In some existing memory devices, the number of memory arrays and hence the number of straps, is relatively large. A large number of periodically recurring straps may disadvantageously affect array efficiency, in view of the increasing concern of area cost in advanced semiconductor manufacturing.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Figure 1:
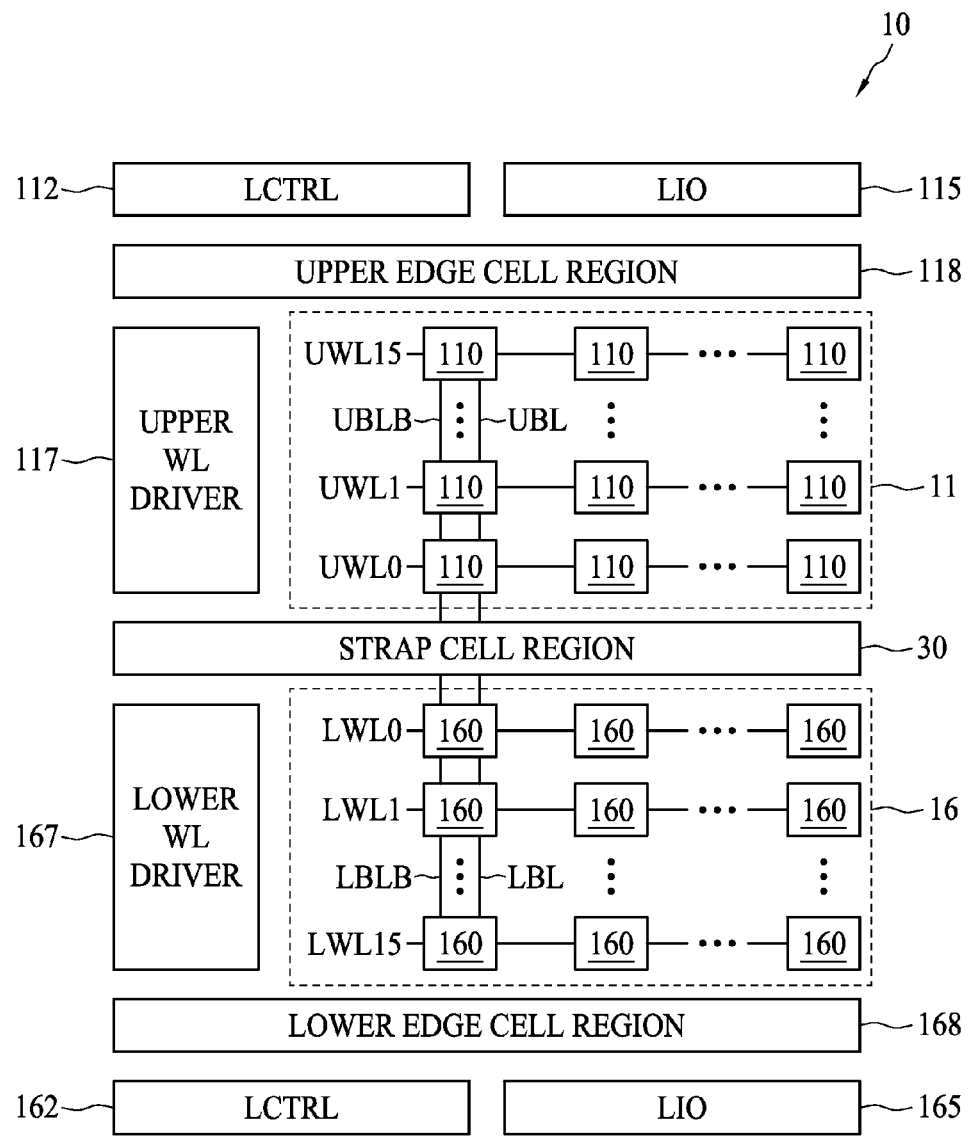
FIG. 1 is a schematic block diagram of a memory device in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled with" another element, it may be directly connected to or coupled to the other element, or intervening elements may be present.

Some embodiments have one or a combination of the following features and/or advantages. In some embodiments, a memory device including memory arrays separated from each other by strap cell regions is provided. The strap cell region is formed with circuits to facilitate operation of memory cells in the memory arrays.

FIG. 1 is a schematic block diagram of a memory device 10 in accordance with some embodiments. Referring to FIG. 1, memory device 10 includes an upper memory array 11, a lower memory array 16, a strap cell region 30, an upper word line (WL) driver 117, a lower WL driver 167, an upper edge cell region 118, a lower edge cell region 168, an upper local control circuit 112, an upper local input/output (I/O) circuit 115, a lower local control circuit 162 and a lower local I/O circuit 165. For illustration, only two memory arrays 11 and 16 are shown. A different number of memory arrays is within the contemplated scope of various embodiments.

Upper memory array 11 includes an array of memory cells 110 arranged in rows and columns. In some embodiments, memory cells 110 include but are not limited to static random access memory (SRAM) cells. Moreover, memory cells 110 are accessible via upper word lines UWL0 to UWL15 and upper bit lines UBL and UBLB. For example, desired data may be written to memory cells 110 in a write cycle and the contents of memory cells 110 may be read in a read cycle. Word lines UWL0 to UWL15 are arranged in the row direction, while bit lines UBL and UBLB are arranged in the column direction. Moreover, upper WL driver 117 is configured to drive a selected one of word lines UWL0 to UWL15 to a desired voltage level during an access operation.

Upper local control circuit 112 controls upper local I/O circuit 115. Further, upper local I/O circuit 115 includes peripheral circuits such as read sensing circuits and write driving circuits that facilitate read and write operations. In some embodiments, upper local I/O circuit 115 includes drivers, decoders, latches, sense amplifiers, buffers, pre-charging circuits and multiplexers.

Upper edge cell region 118, disposed between upper local I/O circuit 115 and upper memory array 11, serves as a pick-up area. Moreover, upper local I/O circuit 115 may also provide the pick-up function.

Memory device 10 may include a symmetrical structure with reference to strap cell region 30. Similar to upper memory array 11, lower memory array 16 includes an array of memory cells 160 arranged in rows and columns. Memory cells 160 include but are not limited to SRAM cells. Moreover, memory cells 160 are accessible via lower word lines LWL0 to LWL15 and lower bit lines LBL and LBLB. Accordingly, desired data may be written to memory cells 160 in a write cycle and the contents of memory cells 160 may be read in a read cycle. Word lines LWL0 to LWL15 are arranged in the row direction, while bit lines LBL and LBLB are arranged in the column direction. Moreover, lower WL driver 167 is configured to drive a selected one of word lines LWL0 to LWL15 to a desired voltage level during an access operation.

Lower local control circuit 162 controls lower local I/O circuit 165. Further, lower local I/O circuit 165 includes peripheral circuits such as read sensing circuits and write driving circuits that facilitate read and write operations. Furthermore, lower edge cell region 168, disposed between lower local I/O circuit 165 and lower memory array 16, serves as a pick-up area. Moreover, lower local I/O circuit 165 may also provide the pick-up function.

Strap cell region 30 is disposed between and provides separation for upper and lower memory arrays 11 and 16. In some embodiments, strap cell region 30 also serves as a pick-up area. In still some embodiments, strap cell region 30 is formed with circuits to facilitate the access operation of memory cells 110 and 160, as will be further discussed later.

Figure 2:
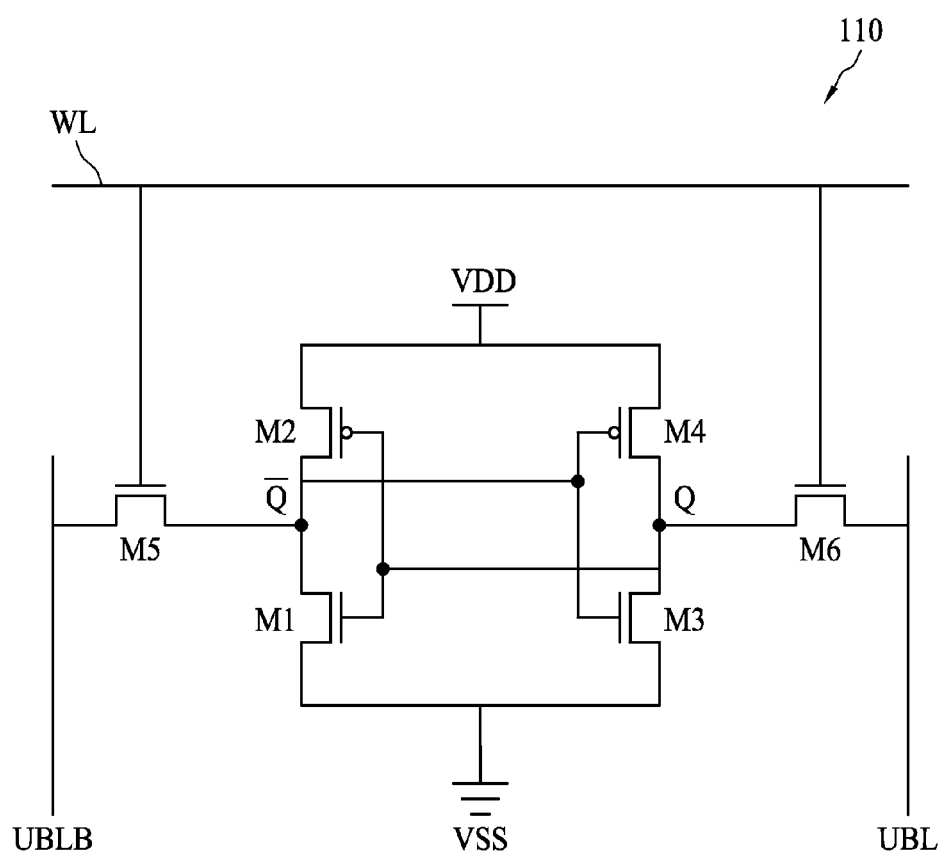
FIG. 2 is a circuit diagram of an exemplary memory cell in the memory device illustrated in FIG. 1.

FIG. 2 is a circuit diagram of an exemplary memory cell 110 in the memory device 10 illustrated in FIG. 1. Memory cell 110 includes but is not limited to a six-transistor (6T) SRAM structure. For example, memory cell 110 in some embodiments may use a 4T, 8T or 10T SRAM structure, and in other embodiments may include a memory-like bit cell or a building unit. Although for illustration memory cell 110 is shown, memory cells 160 have a similar structure to memory cell 110. Referring to FIG. 2, memory cell 110 includes a first inverter formed by transistors M1 and M2, a second inverter formed by transistors M3 and M4, and access transistors or pass gates M5 and M6. Transistors M1, M3, M5 and M6 include n-type metal-oxide-semiconductor (NMOS) transistors, and transistors M2 and M4 include p-type metal-oxide-semiconductor (PMOS) transistors.

The first and second inverters are cross coupled to each other to form a latching circuitry for data storage. A source of each of transistors M2 and M4 is coupled to a power supply VDD, while a source of each of transistors M1 and M3 is coupled to a reference voltage VSS, for example, ground.

A gate of pass gate M6 is coupled to a word line WL. A drain of pass gate M6 is coupled to a bit line UBL. Moreover, a source of pass gate M6 is coupled to drains of transistors M4 and M3 and also to gates of M2 and M1.

Similarly, a gate of pass gate M5 is coupled to the word line WL. A drain of pass gate M5 is coupled to a complementary bit line UBLB. Moreover, a source of pass gate M5 is coupled to drains of transistors M2 and M1 and also to gates of M4 and M3.

Memory cell 110 operates in three different modes: standby, reading and writing. In standby mode, memory cell 110 is idle and is not accessed. If the word line WL is not asserted, pass gates M5 and M6 disconnect memory cell 110 from bit lines UBL and UBLB. The cross-coupled inverters formed by transistors M1 to M4 function to reinforce each other as long as they are connected to a power supply.

Access to memory cell 110 is enabled by the word line WL, which controls pass gates M5 and M6 which, in turn, control whether memory cell 110 should be connected to bit lines UBL and UBLB. Assume that the content of memory cell 110 is a logical 0, stored at Q. A read cycle is started by precharging both bit lines UBL and UBLB to a logical 1, then asserting the word line WL, enabling both pass gates M5 and M6. The second step occurs when the values stored in Q and $\overline{Q}$ are transferred to bit lines by leaving UBLB at its precharged value and discharging UBL through M6 and M3 to a logical 0. On the UBLB side, transistors M2 and M5 pull bit line UBLB toward VDD, a logical 1. If the content of memory cell 110 is a logical 1, the opposite would happen and UBL would be pulled toward 1 while UBLB toward 0. Then these bit lines UBL and UBLB will have a voltage difference between them, which is sent to a sense amplifier (not shown) in upper local I/O circuit 115. The sense amplifier senses the voltage difference between UBL and UBLB, amplifies the difference, and determines the content of memory cell 110 being read out.

As to the writing mode, a write cycle is started by applying a value to be written to bit lines UBL and UBLB. If a logical 0 is to be written, a logical 0 is applied to the bit lines by driving bit lines UBLB to 1 and UBL to 0 via a write driver (not shown) in upper local I/O circuit 115. A logical 0 is written to Q through M6 as the word line WL is asserted to discharge Q via bit line UBL already at a low logical state.

An SRAM cell may suffer disturbance during an access operation. Specifically, during a read cycle, the storage node Q storing a logical low value is charged by one of the bit lines UBL and UBLB, and if a voltage of the storage node Q rises above a switching threshold of the inverter driven by the storage node Q, stored data is destroyed, an issue referred to as read disturbance. Further, during a write cycle, other memory cells in the same row as an accessed memory cell experience read disturbance, and data in the other cells is potentially destroyed, an issue referred to as dummy read disturbance.

For memory cell 110, stored data at Q should be readable and should not be toggled in a read cycle, and on the other hand should be able to flip to a desired logical state in a write cycle. Moreover, memory cell 110 should be robust enough to ensure that the read disturbance issue does not occur during a read cycle. Furthermore, while updating the stored data, the other memory cells in the same row as a selected memory cell should be robust enough to ensure that the dummy read disturbance issue does not occur. As will be described with reference to FIGS. 3 to 7, to prevent the disturbances, assistant circuits are provided in strap cell region 30.

Figure 3:
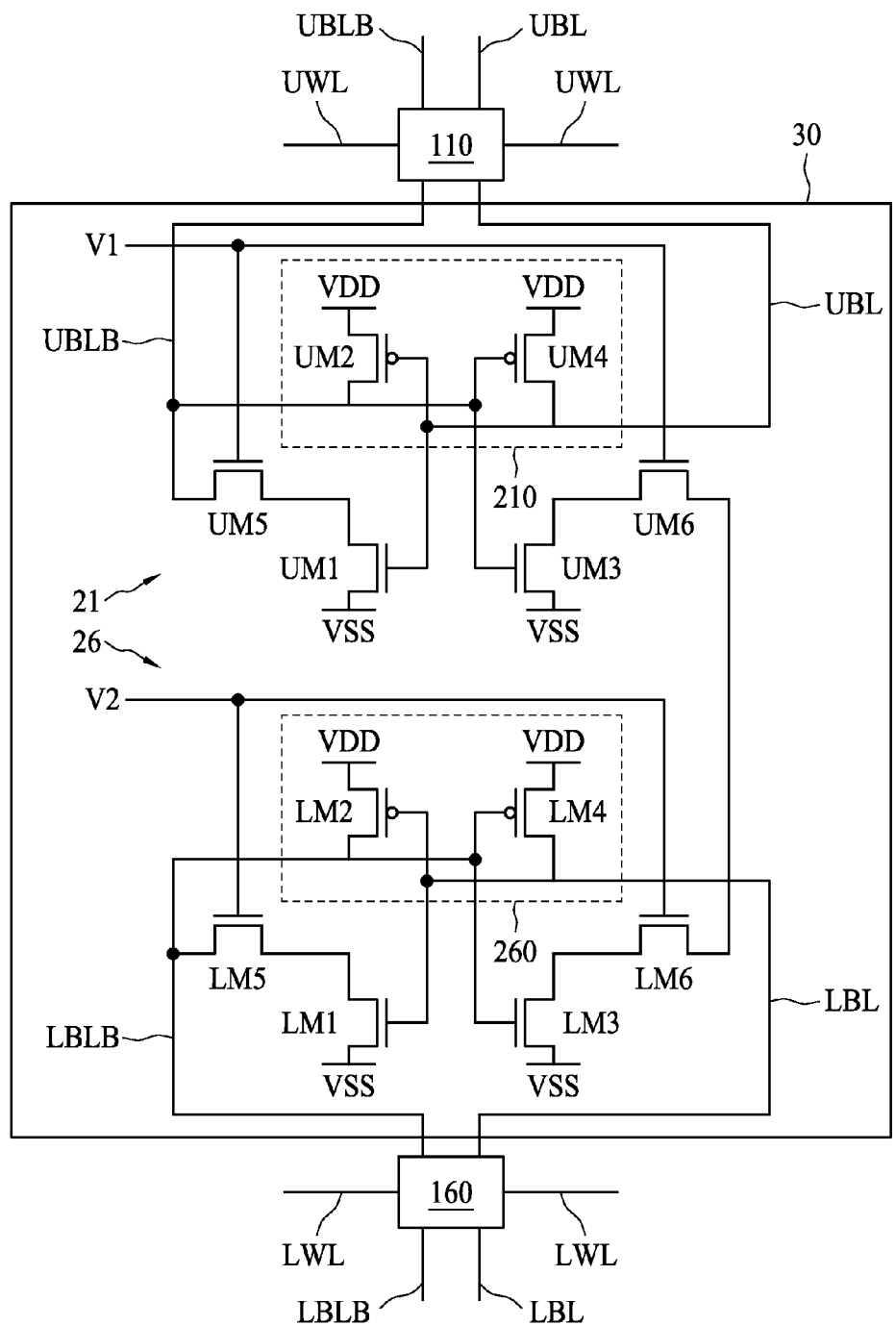
FIG. 3 is a diagram of a circuit in a strap cell region of the memory device illustrated in FIG. 1 in accordance with some embodiments.

FIG. 3 is a diagram of circuits 21 and 26 in strap cell region 30 of the memory device 10 illustrated in FIG. 1 in accordance with some embodiments. Referring to FIG. 3, circuits 21 and 26 have a symmetrical structure, and are configured to facilitate an access operation of upper memory cell 110 and lower memory cell 160, respectively. Circuits 21 and 26 have a "quasi-cell" structure, which is similar to but different from memory cell 110 or 160. Moreover, by modifying back-end layers such as metal-0 oxide diffusion-1 (M0OD1), via-0 (VIA0) and metal-1 (M1) layers, circuits 21 and 26 can be formed in strap cell region 30 as normal cells 110 and 160 are formed in memory arrays 11 and 16.

Circuit 21 includes transistors UM1 to UM6. Transistors UM2 and UM4 are PMOS transistors, while transistors UM1, UM3, UM5 and UM6 are NMOS transistors. Transistors UM2 and UM4 serve as pull-up transistors. A gate of transistor UM2 is connected to upper bit line UBL. A source of transistor UM2 receives power supply VDD. A drain of transistor UM2 is connected to bit line UBLB. Further, a gate of transistor UM4 is connected to the drain of transistor UM2 and also to bit line UBLB. A source of transistor UM4 receives VDD. A drain of transistor UM4 is connected to the gate of transistor UM2 and also to bit line UBL. Transistors UM2 and UM4 form a cross-coupled PMOS structure. Cross-coupled PMOS transistors in some existing approaches are formed in an I/O region or a peripheral region. Providing cross-coupled PMOS transistors UM2 and UM4 in strap cell region 30 either saves the corresponding space in the peripheral region or makes space for other circuits or components in the peripheral region, resulting in a more efficient area management.

Transistors UM1 and UM3 serve as pull-down transistors. A gate of transistor UM1 is connected to the gate of transistor UM2 and also to bit line UBL. A source of transistor UM1 receives VSS. Further, a gate of transistor UM3 is connected to the gate of transistor UM4 and also to bit line UBLB. A source of transistor UM3 receives VSS.

Transistors UM5 and UM6 serve as pass gates. A gate of transistor UM5 receives a power supply V1, the level of which is controlled by, for example, upper local control circuit 112. A drain of transistor UM5 is connected to the gate of transistor UM4 and also to bit line UBLB. A source of transistor UM5 is connected to a drain of transistor UM1. Further, a gate of transistor UM6 receives power supply V1. A source of transistor UM6 is connected to a drain of transistor UM3.

Likewise, circuit 26 includes transistors LM1 to LM6. Transistors LM2 and LM4 are PMOS transistors, while transistors LM1, LM3, LM5 and LM6 are NMOS transistors. Transistors LM2 and LM4 serve as pull-up transistors. A gate of transistor LM2 is connected to lower bit line LBL. A source of transistor LM2 receives VDD. A drain of transistor LM2 is connected to bit line LBLB. Further, a gate of transistor LM4 is connected to the drain of transistor LM2 and also to bit line LBLB. A source of transistor LM4 receives VDD. A drain of transistor LM4 is connected to the gate of transistor LM2 and also to bit line LBL. Transistors LM2 and LM4 form a cross-coupled PMOS structure. Providing cross-coupled PMOS transistors LM2 and LM4 in strap cell region 30, which would otherwise be formed in a peripheral region, achieves a more efficient area management.

Transistors LM1 and LM3 serve as pull-down transistors. A gate of transistor LM1 is connected to the gate of transistor LM2 and also to bit line LBL. A source of transistor LM1 receives VSS. Further, a gate of transistor LM3 is connected to the gate of transistor LM4 and also to bit line LBLB. A source of transistor LM3 receives VSS.

Transistors LM5 and LM6 serve as pass gates. A gate of transistor LM5 receives a power supply V2, the level of which is controlled by, for example, lower local control circuit 162. A drain of transistor LM5 is connected to the gate of transistor LM4 and also to bit line LBLB. A source of transistor LM5 is connected to a drain of transistor LM1. Further, a gate of transistor LM6 receives power supply V2. A source of transistor LM6 is connected to a drain of transistor LM3. A drain of transistor LM6 is connected to a drain of transistor UM6 in circuit 21. Operation of circuits 21 and 26 will be discussed with reference to FIGS. 4 to 6.

Figure 4:
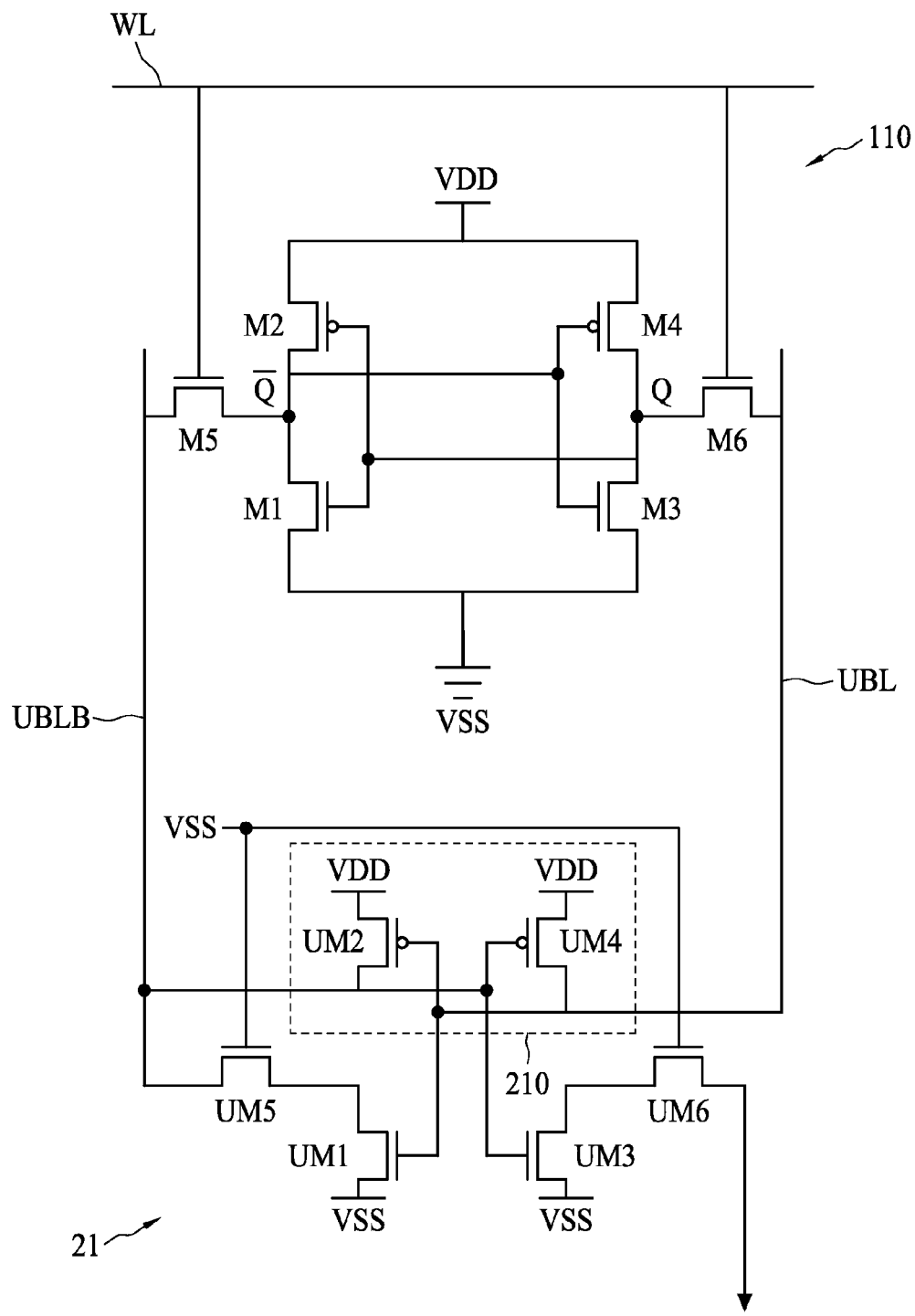
FIG. 4 is a circuit diagram illustrating an operation of the circuit illustrated in FIG. 3 in accordance with some embodiments.

FIG. 4 is a circuit diagram illustrating an operation of the circuit 21 illustrated in FIG. 3 in accordance with some embodiments. Referring to FIG. 4, gate of transistor UM4 is in connection with drain of transistor M5 of memory cell 110 via bit line UBLB, while gate of transistor UM2 is in connection with drain of transistor M6 of memory cell 110. Moreover, transistors UM5 and UM6 are biased at VSS, and thus are turned off.

Assume that the content of memory cell 110 at $\overline{Q}$ is a logical 0 (and thus at $\overline{Q}$ is a logical 1). When the exemplary memory cell 110 is accessed during a read cycle, bit lines UBLB and UBL are precharged to logical 1 before starting a read access. Transistors M5 and M6 are turned on as word line WL is asserted. Moreover, transistor M3 is turned on since the voltage level at $\overline{Q}$ is logical 1. As a result, bit line UBL is discharged through transistors M6 and M3. Subsequently, transistor UM2 is turned on when the voltage level at bit line UBL falls below VDD minus the threshold of transistor UM2. As transistor UM2 is turned on, a current flowing from the source at VDD to the drain of transistor UM2, charging bit line UBLB to logical 1, which stabilizes the voltage level, logical 1, at bit line UBLB. Effectively, circuit 21 facilitates differentiating the voltages levels at bit lines UBL and UBLB.

Assume that the content of memory cell 110 at Q is to be written to logical 0 during a write cycle. Bit lines UBL and UBLB are written to logical 0 and logical 1 at the beginning, respectively. Since bit line UBL is written to logical 0, transistor UM2 is turned on, which charges bit line UBLB to logical 1. Accordingly, circuit 21 facilitates the voltage level, logical 1, to stabilize at bit line UBLB.

Further, assume that the content of memory cell 110 at Q is a logical 1 (and thus at $\overline{Q}$ is a logical 0). When the exemplary memory cell 110 is accessed during a read cycle, bit lines UBLB and UBL are precharged to logical 1 before starting a read access. Transistors M5 and M6 are turned on as word line WL is asserted. Moreover, transistor M1 is turned on since the voltage level at Q is logical 1. As a result, bit line UBLB is discharged through transistors M5 and M1. Subsequently, transistor UM4 is turned on when the voltage level at bit line UBLB falls below VDD minus the threshold of transistor UM4. As transistor UM4 is turned on, a current flowing from the source at VDD to the drain of transistor UM4, charging bit line UBL to logical 1, which stabilizes the voltage level, logical 1, at bit line UBL. Effectively, circuit 21 facilitates differentiating the voltages levels at bit lines UBL and UBLB.

Assume that the content of memory cell 110 at Q is to be written to logical 1 during a write cycle. Bit lines UBL and UBLB are written to logical 1 and logical 0 at the beginning, respectively. Since bit line UBLB is written to logical 0, transistor UM4 is turned on, which charges bit line UBL to logical 1. Accordingly, circuit 21 facilitates the voltage level, logical 1, to stabilize at bit line UBL.

Since circuits 21 and 26 are symmetrical to each other, operation of circuit 26 is not discussed. Circuit 26, like circuit 21, facilitates the access operation of memory cell 160.

Figure 5:
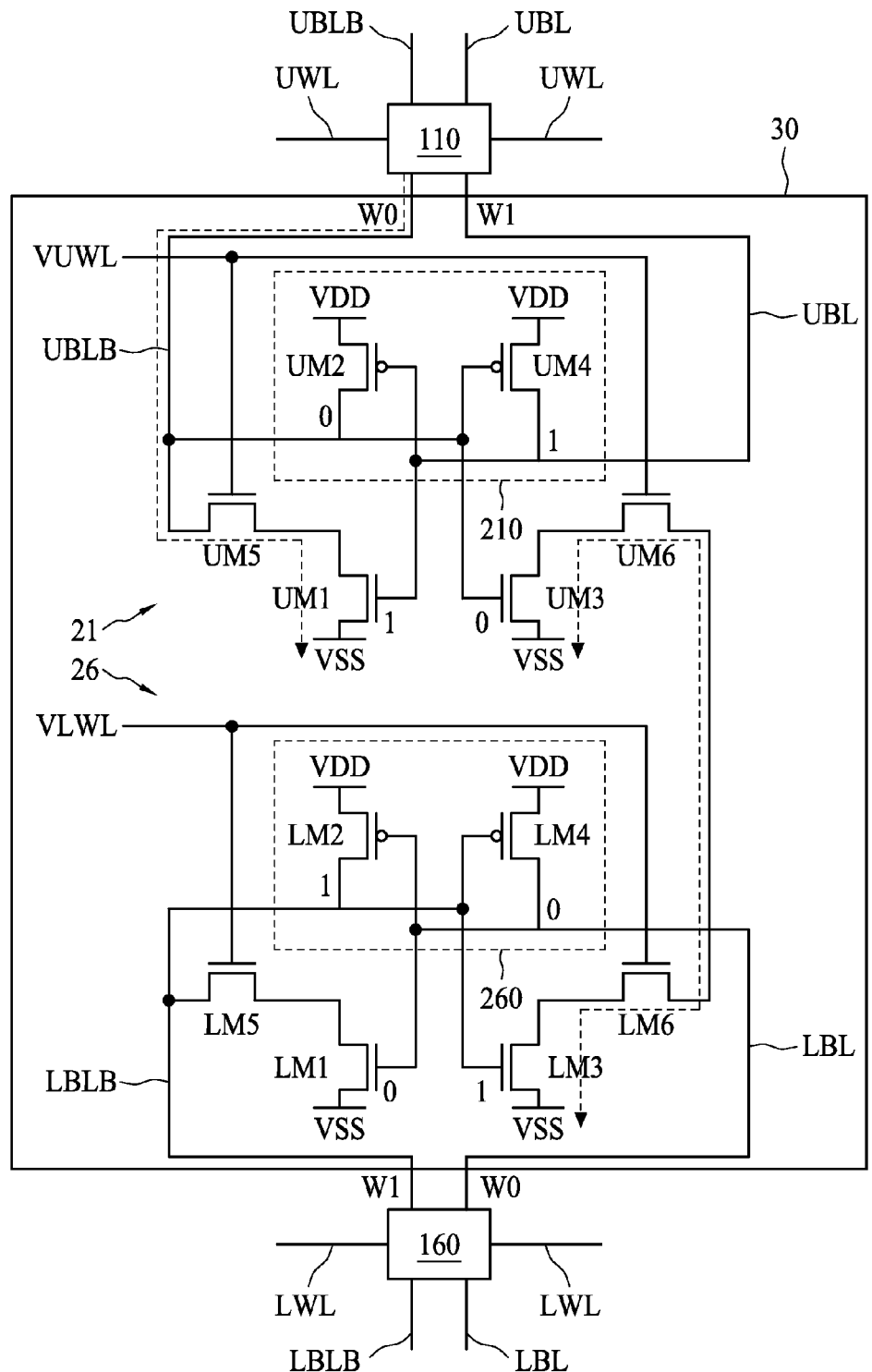
FIG. 5 is a circuit diagram illustrating another operation of the circuit illustrated in FIG. 3 in accordance with some embodiments.

FIG. 5 is a circuit diagram illustrating another operation of the circuits 21 and 26 illustrated in FIG. 3 in accordance with some embodiments. Operation of circuits 21 and 26 is similar to that in FIG. 4 except that, for example, voltages VUWL and VLWL, instead of VSS, are applied to circuits 21 and 26, respectively, during a write cycle.

Assume that the content of memory cell 110 is to be written to logical 1 at the UBL side during a write cycle. Referring to FIG. 5, bit lines UBL and UBLB are written to logical 1 and logical 0, respectively. As the word line UWL associated with memory cell 110 is asserted, voltage VUWL is applied to transistors UM5 and UM6 and turns on these transistors. Moreover, transistor UM1 is turned on by the high logical level, logical 1, at bit line UBL. Transistors UM5 and UM1, when turned on, establish a discharging path that facilitates bit line UBLB to discharge to VSS. The discharging path connects the drain of transistor M5 (see, for example, FIG. 4) of memory cell 110 via the cascode-connected transistors UM5 and UM1 to VSS. Effectively, the write-0 operation for the accessed memory cell 110 at the UBLB side and hence the write-1 operation for the accessed memory cell 110 at the UBL side are stabilized.

Further, assume that the content of memory cell 160 is to be written to logical 0 at the LBL side during a write cycle. Referring to FIG. 5, bit lines LBL and LBLB are written to logical 0 and logical 1, respectively. As the word line LWL associated with memory cell 160 is asserted, voltage VLWL is applied to transistors LM5 and LM6 and turns on these transistors. Moreover, transistor LM3 is turned on by the high logical level, logical 1, at bit line LBLB. Transistors LM6 and LM3, when turned on, establish a discharging path. Nevertheless, the discharging path is not in connection with the accessed memory cell 160 and may not help the write operation. Even so, the discharging path does not affect the normal write operation in the accessed memory cell 160.

As previously mentioned, circuits 21 and 26 have a symmetrical structure. Accordingly, writing the content of memory cell 110 to logical 0 at the UBL side is similar to the case of writing the content of memory cell 160 to logical 0 at the LBL side as described above. Moreover, writing the content of memory cell 160 to logical 1 at the LBL side is similar to the case of writing the content of memory cell 110 to logical 1 at the UBL side as described above.

Figure 6:
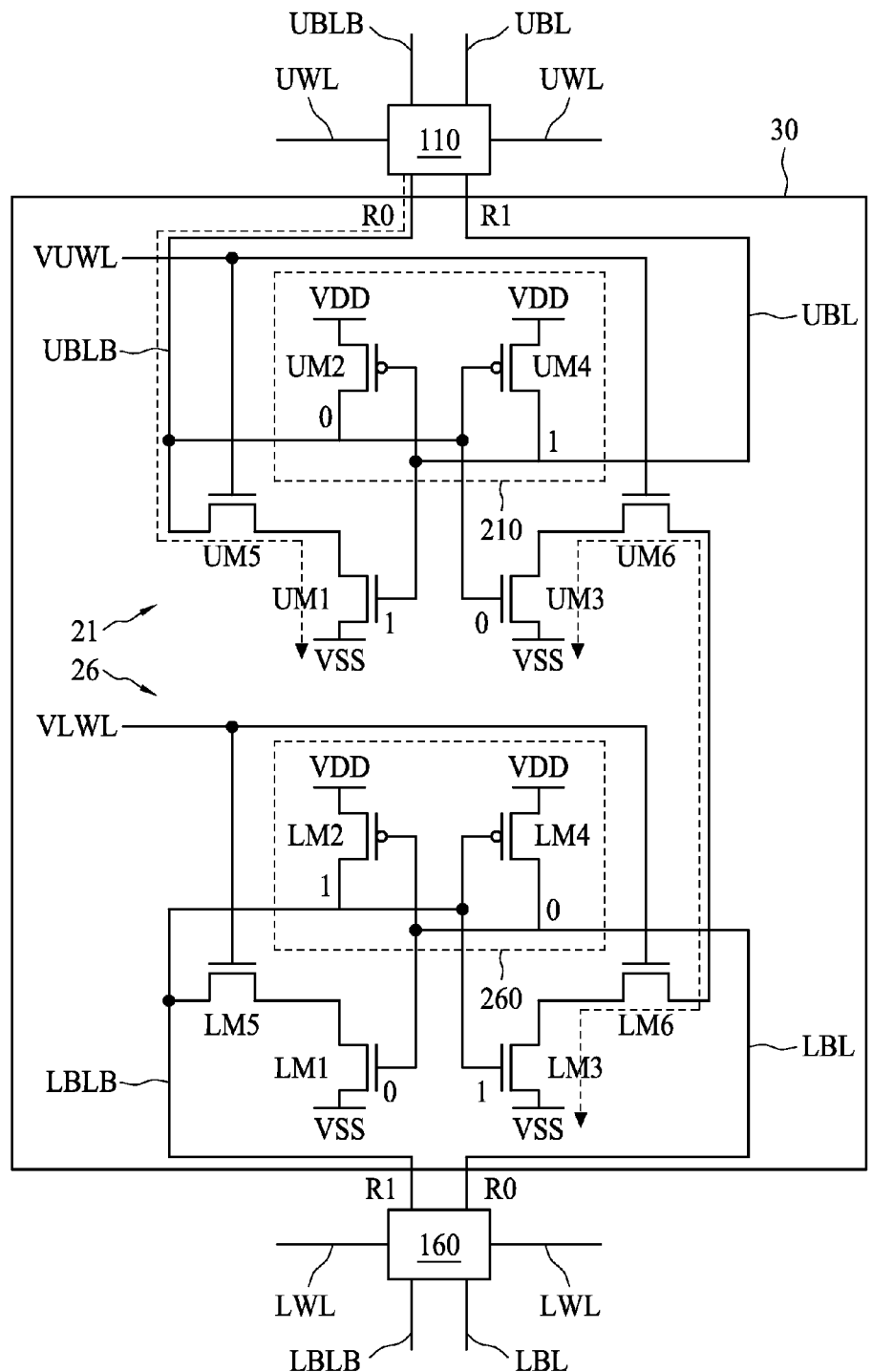
FIG. 6 is a circuit diagram illustrating still another operation of the circuit illustrated in FIG. 3 in accordance with some embodiments.

FIG. 6 is a circuit diagram illustrating still another operation of the circuits 21 and 26 illustrated in FIG. 3 in accordance with some embodiments. Operation of circuits 21 and 26 is similar to that in FIG. 4 except that, for example, voltages VUWL and VLWL, instead of VSS, are applied to circuits 21 and 26, respectively, during a read cycle.

Referring to FIG. 6, assume that the content of memory cell 110 is a logical 1 at the UBL side. During a read cycle, bit lines UBL and UBLB are precharged to logical 1 before starting a read access. Word line UWL associated with the accessed memory cell 110 is then asserted, enabling bit lines UBL and UBLB to differentiate in voltage level. Subsequently, after word line UWL is asserted for a while, voltage VUWL is then applied to transistors UM5 and UM6 and turns on these transistors. Moreover, transistor UM1 is turned on by the high logical level, logical 1, at bit line UBL. Transistors UM5 and UM1, when turned on, establish a discharging path that facilitates bit line UBLB to discharge to VSS and to differentiate from bit line UBL. The discharging path connects the drain of transistor M5 (see, for example, FIG. 4) of memory cell 110 via the cascode-connected transistors UM5 and UM1 to VSS. Effectively, the read operation for the accessed memory cell 110 is stabilized.

Further, assume that the content of memory cell 160 is a logical 0 at the LBL side. During a read cycle, bit lines LBL and LBLB are precharged to logical 1 before starting a read access. Word line LWL associated with the accessed memory cell 160 is then asserted, enabling bit lines LBL and LBLB to differentiate in voltage level. Subsequently, after word line LWL is asserted for a while, voltage VLWL is then applied to transistors LM5 and LM6 and turns on these transistors. Moreover, transistor LM3 is turned on by the high logical level, logical 1, at bit line LBLB. Transistors LM6 and LM3, when turned on, establish a discharging path. Nevertheless, the discharging path is not in connection with the accessed memory cell 160 and may not help the read operation. Even so, the discharging path does not affect the normal read operation in the accessed memory cell 160.

Since circuits 21 and 26 have a symmetrical structure, reading the content of memory cell 110 that stores logical 0 at the UBL side is similar to the case of reading the content of memory cell 160 that stores logical 0 at the LBL side as described above. Moreover, reading the content of memory cell 160 that stores logical 1 at the LBL side is similar to the case of reading the content of memory cell 110 that stores logical 1 at the UBL side as described above.

Figure 7:
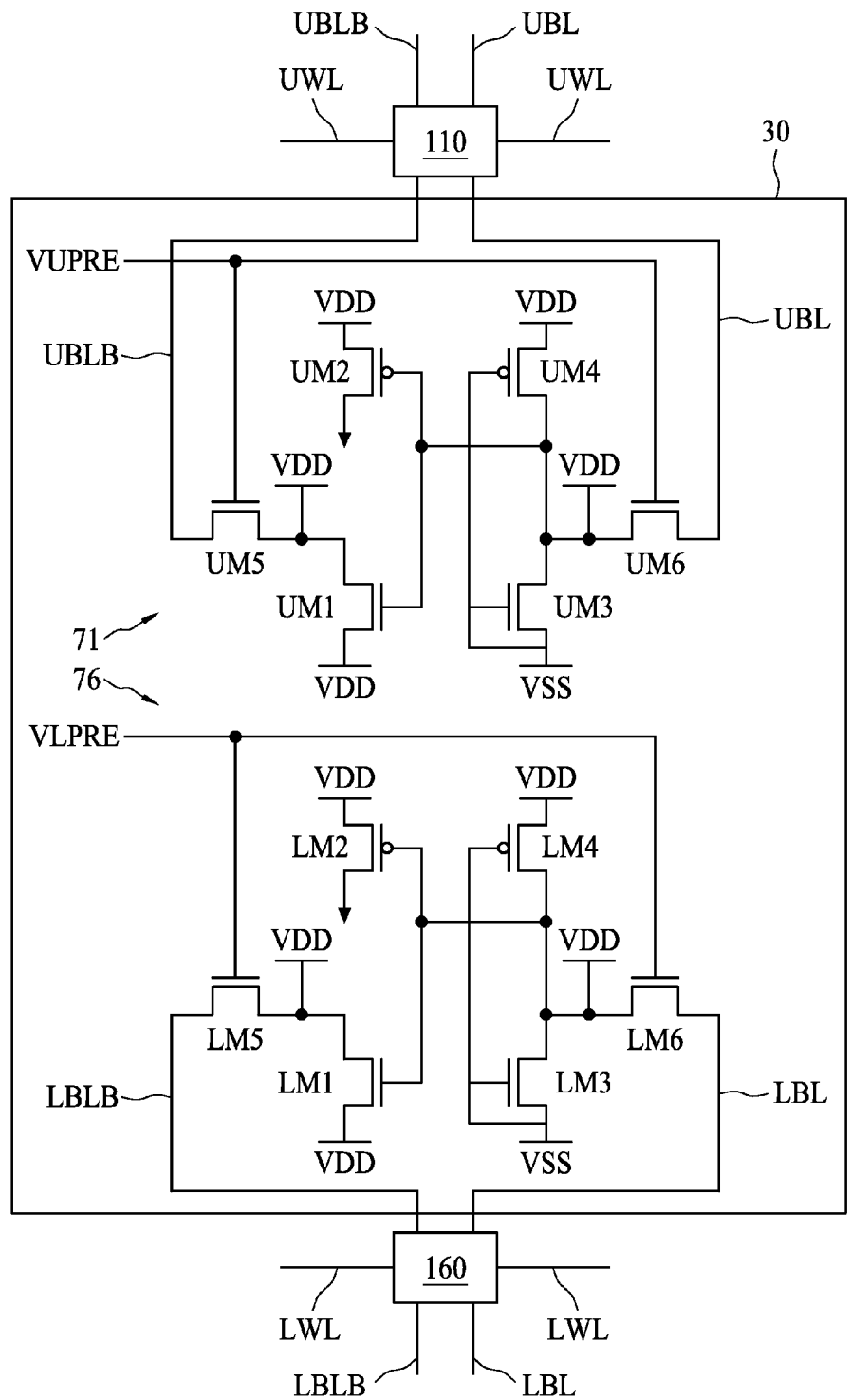
FIG. 7 is a diagram of a circuit in a strap cell region of the memory device illustrated in FIG. 1 in accordance with some embodiments.

FIG. 7 is a diagram of circuits 71 and 76 in strap cell region 30 of memory device 10 illustrated in FIG. 1 in accordance with some embodiments. Referring to FIG. 7, circuits 71 and 76 have a symmetrical structure, and are configured to facilitate an access operation of upper memory cell 110 and lower memory cell 160, respectively. Circuits 71 and 76 have a "quasi-cell" structure, which is similar to but different from memory cell 110 or 160. Moreover, by modifying back-end layers such as M0OD1, VIA0 and M1 layers, circuits 71 and 76 can be formed in strap cell region 30 as normal cells 110 and 160 are formed in memory arrays 11 and 16.

Circuit 71 includes transistors UM1 to UM6. Transistors UM2 and UM4 are PMOS transistors. A gate of transistor UM2 receives VDD. As a result, transistor UM2 is kept at an off state. A source of transistor UM2 receives VDD. A drain of transistor UM2 is floating. Further, a source of transistor UM4 receives VDD. A drain of transistor UM4 is connected to the gate of transistor UM2 and also to VDD. A gate of transistor UM4 receives VSS. As a result, transistor UM4 is kept at an off state because its drain to source voltage is zero ($V_{DS}=0$).

Transistors UM1 and UM3 are NMOS transistors. A gate of transistor UM1 is connected to the gate of transistor UM2, the drain of transistor UM4 and also to VDD. As a result, transistor UM1 is kept at an off state because its drain to source voltage is zero ($V_{DS}=0$). A source of transistor UM1 receives VDD. A drain of transistor UM1 also receives VDD. Further, a gate of transistor UM3 is connected to the gate of transistor UM4 and also to VSS. As a result, transistor UM3 is kept at an off state. A source of transistor UM3 receives VSS. A drain of transistor UM3 is connected to the gate of transistor UM2, the drain of transistor UM4 and also to VDD.

Transistors UM5 and UM6 are also NMOS transistors. A gate of transistor UM5 receives a power supply VUPRE, the level of which is controlled by, for example, upper local control circuit 112 in FIG. 1. A drain of transistor UM5 is connected to bit line UBLB. A source of transistor UM5 is connected to the drain of transistor UM1 and also to VDD. Further, a gate of transistor UM6 receives power supply VUPRE. A source of transistor UM6 is connected to the drain of transistor UM3, the gate of transistor UM2, the drain of transistor UM4 and also to VDD. A drain of transistor UM6 is connected to bit line UBL.

Likewise, circuit 76 includes transistors LM1 to LM6. Transistors LM2 and LM4 are PMOS transistors. A gate of transistor LM2 receives VDD. As a result, transistor LM2 is kept at an off state. A source of transistor LM2 receives VDD. A drain of transistor LM2 is floating. Further, a source of transistor LM4 receives VDD. A drain of transistor LM4 is connected to the gate of transistor LM2 and also to VDD. A gate of transistor LM4 receives VSS. As a result, transistor LM4 is kept at an off state because its drain to source voltage is zero ($V_{DS}=0$).

Transistors LM1 and LM3 are NMOS transistors. A gate of transistor LM1 is connected to the gate of transistor LM2, the drain of transistor LM4 and also to VDD. As a result, transistor LM1 is kept at an off state because its drain to source voltage is zero ($V_{DS}=0$). A source of transistor LM1 receives VDD. A drain of transistor LM1 also receives VDD. Further, a gate of transistor LM3 is connected to the gate of transistor LM4 and also to VSS. As a result, transistor LM3 is kept at an off state. A source of transistor LM3 receives VSS. A drain of transistor LM3 is connected to the gate of transistor LM2, the drain of transistor LM4 and also to VDD.

Transistors LM5 and LM6 are also NMOS transistors. A gate of transistor LM5 receives a power supply VLPRE, the level of which is controlled by, for example, lower local control circuit 162 in FIG. 1. A drain of transistor LM5 is connected to bit line LBLB. A source of transistor LM5 is connected to the drain of transistor LM1 and also to VDD. Further, a gate of transistor LM6 receives power supply VLPRE. A source of transistor LM6 is connected to the drain of transistor LM3, the gate of transistor LM2, the drain of transistor LM4 and also to VDD. A drain of transistor LM6 is connected to bit line LBL.

In operation, taking circuit 71 as an example, voltage VUPRE is applied to the gates of transistors UM5 and UM6 when bit lines UBL and UBLB need to be precharged during a pre-charge stage. As transistor UM6 is turned on, transistor UM6 with its source connected to VDD provides a charging path for bit line UBL. Furthermore, as transistor UM5 is turned on, transistor UM5 with its source connected to VDD provides a charging path for bit line UBLB. Effectively, bit lines UBL and UBLB are fast charged to a logically partial high value of VDD minus the threshold of UM5 or UM6.

Moreover, taking circuit 76 as an example, assume that memory cell 160, which stores logical 0 at the LBL side at the beginning, is going to be written to logical 1 next. In operation, voltage VLPRE is applied to the gate of transistor LM6 when LWL is asserted during a write cycle. As transistor LM6 is turned on, bit line LBL will not be discharged to a level below VDD minus the threshold of transistor LM6 by cell 160. Transistor LM6 provides a charging path for bit line LBL. Effectively, bit line LBL is kept at the level of VDD minus the threshold of transistor LM6 instead of being discharged to ground, which significantly reduces the risk of dummy read disturbance for write cycle. As previously discussed, write access will become difficult if bit line LBL is discharged to ground first due to dummy read.

Likewise, assume that memory cell 160, which stores logical 0 at the LBLB side at the beginning, is going to be written to logical 1 next. In operation, voltage VLPRE is applied to the gate of transistor LM5 when LWL is asserted during a write cycle. As transistor LM5 is turned on, bit line LBLB will not be discharged to a level below VDD minus the threshold of transistor LM5 by cell 160. Transistor LM5 provides a charging path for bit line LBLB. Effectively, bit line LBLB is kept at the level of VDD minus the threshold of transistor LM5 instead of being discharged to ground, which significantly reduces the risk of dummy read disturbance for write cycle. Accordingly, circuits 71 and 76 facilitate an access operation of memory cells 110 and 160, respectively.

Embodiments of the present disclosure provide a circuit (21, 26) that comprises a first transistor (UM2, LM2) and a second transistor (UM4, LM4) in a strap cell region (30) between a first memory array (11) and a second memory array (16) of a memory device (10). The first transistor includes a first node (gate of UM2 or LM2) connected to a first data line (UBL, LBL), and a second node (drain of UM2 or LM2) connected to a second data line (UBLB, LBLB). The first node and the second node of the first transistor are complementary to each other in voltage level. Further, the second transistor includes a first node (gate of UM4 or LM4) connected to the second data line, and a second node (drain of UM4 or LM4) connected to the first data line. The first node and the second node of the second transistor are complementary to each other in voltage level.

In an embodiment, the first transistor is configured to charge the second date line to a logically high value (logical 1) via the first node of the first transistor in response to a logically low value (logical 0) at the first data line.

In an embodiment, the second transistor is configured to charge the first date line to a logically high value via the first node of the second transistor in response to a logically low value at the second data line.

In an embodiment, the first data line is coupled with a first access transistor (M6) of a memory cell (110, 160) in one of the first and second memory arrays, and the second data line is coupled with a second access transistor (M5) of the memory cell.

In some embodiments, the circuit further comprises an access transistor (UM5, LM5) biased at a controlled voltage (V1, V2). The access transistor includes a first terminal (drain of UM5 or LM5) connected to the second data line.

In an embodiment, the controlled voltage (V1, V2) includes a reference voltage (VSS).

In some embodiments, the circuit further comprises a third transistor (UM1, LM1) that includes a gate connected to the first data line, and a terminal (drain of UM1 or LM1) connected to a second terminal (source of UM5 or LM5) of the access transistor. Moreover, the third transistor and the access transistor form a discharging path for the second data line in response to a logically high value at the first data line.

Some embodiments of the present disclosure provide a memory device (10) comprising a first memory array (11) including first memory cells (110), a second memory array (16) including second memory cells (160), a strap cell region (30) between the first memory array and the second memory array, and a first circuit (21) in the strap cell region. The first circuit comprises a pair of cross-coupled transistors (UM2, UM4) including a first node (gate of UM2) connected to a first data line (UBL), and a second node (gate of UM4) connected to a second data line (UBLB). Moreover, a first transistor (UM2) of the cross-coupled pair is configured to charge the second data line to a logically high value in response to a logically low value at the first data line, and a second transistor (UM4) of the cross-coupled pair is configured to charge the first data line to a logically high value in response to a logically low value at the second data line.

In an embodiment, the memory device further comprises an access transistor (UM5) biased at a controlled voltage (VUWL). Furthermore, the access transistor includes a first terminal (drain of UM5) connected to the second data line.

In an embodiment, the memory device further comprises a third transistor (UM1) including a gate connected to the first data line, and a terminal (drain of UM1) connected to a second terminal (source of UM5) of the access transistor. Moreover, the third transistor and the access transistor form a discharging path for the second data line in response to a logically high value at the first data line.

In some embodiments, the memory device further comprises a second circuit (26) in the strap cell region. The second circuit comprises a pair of cross-coupled transistors (LM2, LM4) including a first node (gate of LM2) connected to the first data line, and a second node (gate of LM4) connected to the second data line. Moreover, a first transistor (LM2) of the cross-coupled pair of the second circuit is configured to charge the second data line to a logically high value in response to a logically low value at the first data line, and a second transistor (LM4) of the cross-coupled pair of the second circuit is configured to charge the first data line to a logically high value in response to a logically low value at the second data line.

In an embodiment, the memory device further comprises an access transistor (LM5) biased at a controlled voltage (VLWL). Furthermore, the access transistor includes a first terminal (drain of LM5) connected to the second data line.

In an embodiment, the memory device further comprises a third transistor (LM1) including a gate connected to the first data line, and a terminal (drain of LM1) connected to a second terminal (source of LM5) of the access transistor. Moreover, the third transistor and the access transistor form a discharging path for the second data line in response to a logically high value at the first data line.

Embodiments of the present disclosure also provide a circuit (71, 76) in a strap cell region between a first memory array and a second memory array of a memory device. The circuit comprises a first transistor (UM6, LM6), which is biased at a controlled voltage (VUPRE, VLPRE), and configured to charge a first data line (UBL, LBL) to a logically high value during an access operation of a memory cell (110, 160) in one of the first and second memory arrays. The circuit also comprises a second transistor (UM5, LM5), which is biased at the controlled voltage, and configured to charge a second data line (UBLB, LBLB) to a logically high value during the access operation of the memory cell.

In an embodiment, each of the first and second transistors includes a terminal (source of UM5, UM6; source of LM5, LM6) to receive a power supply voltage.

In an embodiment, the circuit further comprises a third transistor (UM4, LM4) configured to be kept at an off state due to $V_{DS}=0$. Moreover, the first transistor with a source terminal connected to VDD forms a charging path for the first data line.

In some embodiments, the circuit further comprises a fourth transistor (UM1, LM1) configured to be kept at an off state due to $V_{DS}=0$. Moreover, the second transistor with a source terminal connected to VDD forms a charging path for the second data line.

Embodiments of the present disclosure provide a method of operating a memory device. The method comprises providing a first transistor and a second transistor in a strap cell region between a first memory array and a second memory array of the memory device, biasing the first transistor and the second transistor at a controlled voltage, charging via the first transistor a first data line to a logically high value during an access operation of a memory cell in one of the first and second memory arrays, and charging via the second transistor a second data line to a logically high value during the access operation of the memory cell.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A circuit, comprising:
    a first transistor in a strap cell region between a first memory array and a second memory array of a memory device, the first transistor including a first node connected to a first data line, and a second node connected to a second data line, the first node and the second node of the first transistor being complementary to each other in voltage level;
    a second transistor, in the strap cell region, including a first node connected to the second data line, and a second node connected to the first data line, the first node and the second node of the second transistor being complementary to each other in voltage level;
    an access transistor biased at a controlled voltage, the access transistor including a first terminal connected to the second data line; and
    a third transistor including a gate connected to the first data line, and a terminal connected to a second terminal of the access transistor.

2. The circuit of claim 1, wherein the first transistor is configured to charge the second date line to a logically high value via the first node of the first transistor in response to a logically low value at the first data line.

3. The circuit of claim 1, wherein the second transistor is configured to charge the first date line to a logically high value via the first node of the second transistor in response to a logically low value at the second data line.

4. The circuit of claim 1, wherein the first data line is coupled with a first access transistor of a memory cell in one of the first and second memory arrays, and the second data line is coupled with a second access transistor of the memory cell.

5. The circuit of claim 1, wherein the controlled voltage includes a reference voltage.

6. The circuit of claim 1, wherein the third transistor and the access transistor form a discharging path for the second data line in response to a logically high value at the first data line.

7. A memory device, comprising:
    a first memory array including first memory cells;
    a second memory array including second memory cells;
    a strap cell region between the first memory array and the second memory array; and
    a first circuit in the strap cell region, the first circuit comprising:
        a pair of cross-coupled transistors including a first node connected to a first data line, and a second node connected to a second data line, wherein a first transistor of the cross-coupled pair is configured to charge the second data line to a logically high value in response to a logically low value at the first data line, and a second transistor of the cross-coupled pair is configured to charge the first data line to a logically high value in response to a logically low value at the second data line;
        an access transistor biased at a controlled voltage, the access transistor including a first terminal connected to the second data line; and
        a third transistor including a gate connected to the first data line, and a terminal connected to a second terminal of the access transistor.

8. The memory device of claim 7, wherein the first node and the second node are complementary to each other in voltage level.

9. The memory device of claim 7, wherein the first data line is coupled with a first access transistor of one of the first memory cells, and the second data line is coupled with a second access transistor of the first memory cell.

10. The memory device of claim 8, wherein the third transistor and the access transistor form a discharging path for the second data line in response to a logically high value at the first data line.

11. The memory device of claim 7 further comprising a second circuit in the strap cell region, the second circuit comprising:
    a pair of cross-coupled transistors including a first node connected to the first data line, and a second node connected to the second data line, wherein a first transistor of the cross-coupled pair of the second circuit is configured to charge the second data line to a logically high value in response to a logically low value at the first data line, and a second transistor of the cross-coupled pair of the second circuit is configured to charge the first data line to a logically high value in response to a logically low value at the second data line.

12. The memory device of claim 11, wherein the first data line is coupled with a first access transistor of one of the second memory cells, and the second data line is coupled with a second access transistor of the second memory cell.

13. The memory device of claim 11 further comprising an access transistor biased at a controlled voltage, the access transistor including a first terminal connected to the second data line.

14. The memory device of claim 13 further comprising a third transistor including a gate connected to the first data line, and a terminal connected to a second terminal of the access transistor, wherein the third transistor and the access transistor form a discharging path for the second data line in response to a logically high value at the first data line.

15. A method of operating a memory device, the method comprising:
    providing a first transistor and a second transistor in a strap cell region between a first memory array and a second memory array of the memory device;
    biasing the first transistor and the second transistor at a controlled voltage;
    charging via the first transistor a first data line to a logically high value during an access operation of a memory cell in one of the first and second memory arrays;
    charging via the second transistor a second data line to a logically high value during the access operation of the memory cell;
    providing an access transistor including a first terminal connected to the second data line; and
    providing a third transistor including a gate connected to the first data line, and a terminal connected to a second terminal of the access transistor.

16. The method of claim 15, wherein each of the first and second transistors includes a terminal to receive a power supply voltage.

17. The method of claim 16, wherein the third transistor is configured to be kept at an off state, and the first transistor forms a charging path for the first data line.

18. The method of claim 16 further comprising providing a fourth transistor configured to be kept at an off state, wherein the second transistor forms a charging path for the second data line.

* * * * *